US006799312B1

(12) United States Patent
Tsai et al.

(10) Patent No.: US 6,799,312 B1
(45) Date of Patent: Sep. 28, 2004

(54) DARK LINE CD AND XY-CD IMPROVEMENT METHOD OF THE VARIABLE SHAPED BEAM LITHOGRAPHY IN MASK OR WAFER MAKING

(75) Inventors: Fei-Gwo Tsai, Hsin-Chu (TW); Shy-Jay Lin, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/584,428

(22) Filed: Jun. 5, 2000

(51) Int. Cl.[7] .............................................. G06F 17/50
(52) U.S. Cl. .............................. 716/21; 716/19; 716/20
(58) Field of Search ................... 716/19–21; 250/492.2, 250/492.22, 492.23; 430/5, 30

(56) References Cited

U.S. PATENT DOCUMENTS

| | | | | |
|---|---|---|---|---|
| 4,698,509 A | * | 10/1987 | Wells et al. | 250/492.2 |
| 5,250,812 A | * | 10/1993 | Murai et al. | 250/492.2 |
| 5,283,440 A | * | 2/1994 | Sohda et al. | 250/492.2 |
| 5,526,279 A | * | 6/1996 | Dick | 364/491 |
| 5,578,821 A | * | 11/1996 | Meisberger et al. | 250/310 |
| 5,661,307 A | * | 8/1997 | Tanaka et al. | 250/492.2 |
| 5,767,521 A | * | 6/1998 | Takeno et al. | 250/492.2 |
| 5,808,892 A | * | 9/1998 | Tu | 364/468.28 |
| 5,888,682 A | * | 3/1999 | Nakasuji | 430/22 |
| 6,093,932 A | * | 7/2000 | Nakajima | 250/492.22 |
| 6,162,567 A | * | 12/2000 | Watanabe | 430/50 |

OTHER PUBLICATIONS

Fukuda et al, "Analysis of Critical Dimension Control for Optical–, EB–, and X–Ray Lithography Below the 0.2 um Region," IEEE, 1995, pp. 77–78.*

* cited by examiner

Primary Examiner—Vuthe Siek
(74) Attorney, Agent, or Firm—George O. Saile; Stephen B. Ackerman; Larry J. Prescott

(57) ABSTRACT

This invention provides a method of using an electron beam exposure system having an electron beam with a variable shape to form patterns in a layer of resist on a substrate, a mask substrate or an integrated circuit wafer, while maintaining adequate critical dimension control and beam stability. This is accomplished by setting the electron beam to a fixed square beam with a width set to provide optimum XY critical dimension control for exposing a frame pattern surrounding the original pattern. The frame pattern has a width of a first distance and surrounds the outer perimeter of the original pattern. This provides optimum XY critical dimension control at the outer perimeter of the original pattern. The remainder of the exposure field, which is the exposure field with the original pattern and the frame pattern subtracted away is exposed using an electron beam having a variable size and shape. In one embodiment the exposure of the frame pattern is completed before the exposure of the remainder pattern is carried out. Alternatively, the exposure of the remainder pattern can be completed before the exposure of the frame pattern is carried out. The digital design data for the frame pattern and the remainder of the exposure field is formed using a computer processor and the original design data.

18 Claims, 3 Drawing Sheets

DARK LINE CD AND XY-CD IMPROVEMENT METHOD OF THE VARIABLE SHAPED BEAM LITHOGRAPHY IN MASK OR WAFER MAKING

BACKGROUND OF THE INVENTION (1) Field of the Invention

This invention relates to forming images in a layer of resist material with a variable shaped electron beam and more specifically to methods of improving critical dimension and XY critical dimension control.

(2) Description of the Related Art

Electron beam exposure systems using an electron beam with a variable shape are often used in direct exposure of a layer of resist material formed on a substrate such as an integrated circuit wafer or a mask substrate. However critical dimension control can be inadequate for the cutting of the dark line around the circumference of the pattern. Methods providing improved control of dark line critical dimension and XY critical dimension are important.

U.S. Pat. No. 5,578,821 to Meisberger et al. describes an electron beam inspection system and method. In the inspection configuration there is a comparison system for comparing the pattern on a substrate with a second pattern.

U.S. Pat. No. 4,698,509 to Wells et al. describes a pattern generator for supplying beam deflection and blanking signals in an electron beam lithography system.

U.S. Pat. No. 5,808,892 to Tu describes an electron beam processing method for improving micron and submicron line quality and resolution.

U.S. Pat. No. 5,888,682 to Nakasuji describes methods and apparatus for accurately performing proximity-effect correction.

SUMMARY OF THE INVENTION

Electron beam exposure systems are often used in direct exposure of a layer of resist material formed on a substrate such as an integrated circuit wafer or a mask substrate. Advantages in processing efficiency can be gained by using an electron beam having a variable shape. The variable shaped electron beam, however, has less critical dimension control and beam size stability than an electron beam using a fixed beam shape. This loss of critical dimension control can be a problem at the outer circumference of a pattern element.

It is a principle objective of this invention to provide a method of using an electron beam exposure system having an electron beam with a fixed shape and a variable shape to form patterns in a layer of resist on an integrated circuit wafer while maintaining adequate critical dimension control and beam stability.

It is another principle objective of this invention to provide a method of using an electron beam exposure system having an electron beam with a fixed shape and a variable shape to form patterns in a layer of resist on a mask substrate while maintaining adequate critical dimension control and beam stability.

These objectives are accomplished by first setting the electron beam to a fixed beam size and shape. The fixed beam used has a square shape with a width set to provide optimum XY critical dimension control. A frame pattern is then formed around the outer perimeter of the original pattern, hereinafter referred to as the first pattern. The width of the frame pattern is a first distance, wherein the first distance is the width of the fixed beam which provides optimum XY critical dimension control. The fixed beam is then used to expose the frame pattern in a layer of resist. A remainder pattern which is the frame pattern and the first pattern subtracted from the full exposure field is then exposed in the layer of resist using an electron beam having a variable size and shape. This method maintains the advantages of the variable shape electron beam for most of the pattern exposure while maintaining critical dimension control at the critical dimension region of the first pattern.

DESCRIPTION OF THE PREFERRED EMBODIMENTS

Figure 1:
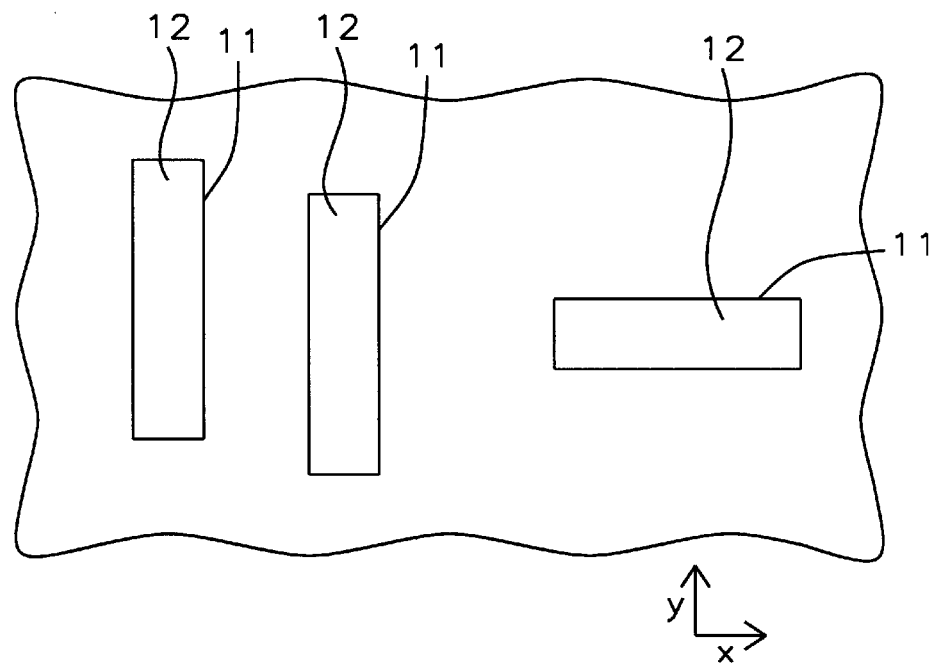
FIG. 1 shows a top view of pattern elements of an original pattern.
Figure 2:
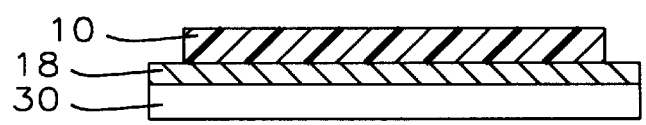
FIG. 2 shows a cross section view of a substrate having a layer of resist formed thereon.

Refer now to FIGS. 1–6 for a description of the preferred embodiments of this invention. FIG. 1 shows a number of first pattern elements 12 each having an outer perimeter 11. FIG. 2 shows a substrate 30 having a layer of opaque material 18 formed on the substrate 30 and a layer of resist material 10 formed on the layer of opaque material 18. The pattern elements 12 are unexposed areas in the layer of resist 10 which has been exposed using an electron beam exposure system. The substrate 30 can be any suitable substrate but in this example the substrate is either an integrated circuit wafer or a mask substrate. In the case where the substrate 30 is a mask substrate the substrate 30 will be formed of a transparent material such as quartz and the opaque material 18 will be a material suitable for forming opaque mask elements, such as chrome. In the case where the substrate 30 is an integrated circuit wafer the wafer 30 will be a material such as silicon and the opaque material 18 will be a material suitable for forming conducting electrodes, such as aluminum, aluminum copper, polysilicon, or the like. The X and Y directions are indicated in FIG. 1. The layer of resist 10 can be either a positive or negative resist.

Figure 3:
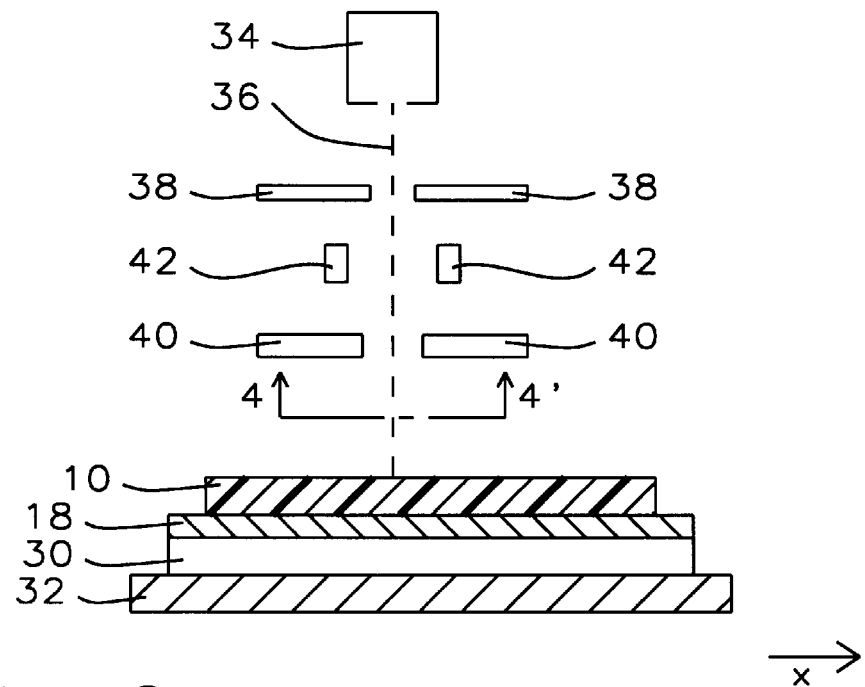
FIG. 3 shows a diagram of an electron beam exposure system.

FIG. 3 shows a diagram of an electron beam exposure system used to expose the layer of resist 10 which is formed on the substrate 30. The substrate 30 is placed on a substrate holder 32 which is capable of moving the substrate 30 in X and Y directions. The X direction is indicated in FIG. 3 and the Y direction is perpendicular to the paper. The electron beam exposure system has a source of electrons 34 producing an electron beam 36. The beam is shaped and positioned using a first aperture 38, a second aperture 40, and a shape deflector 42. The shape deflector 42 uses either a magnetic field or an electric field to adjust the beam size and shape.

Figure 4:
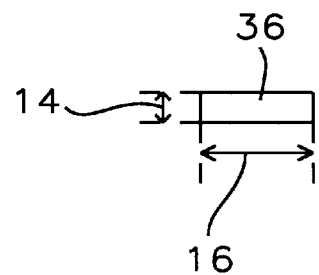
FIG. 4 shows a cross section of the electron beam taken along line 4—4 in FIG. 3.

Conventionally the electron beam exposure system uses a variable beam size and shape, adjusting the beam in various portions of the pattern. A cross section of the electron beam is shown in FIG. 4. As shown in FIG. 4 the beam has a rectangular shape, having a width 14 and a length 16. In this example the beam width is between about 2.0 and 0.01 microns and the beam length is also between about 2.0 and 0.01 microns.

The variable beam size causes problems in critical dimension, CD, control, particularly at the outer perimeter 11 of the first pattern elements 12. The variable beam size can change with time and different beam sizes have a linearity problem. In a test pattern of 121 test points formed in the same mask the X-CD had a range of 0.0364 microns with a 3-sigma of 0.0223 microns; the Y-CD had a range of 0.1036 microns with a 3-sigma of 0.0639 microns; and the XY-CD had a mean of −0.022 microns, a range of 0.101 microns, and a 3-sigma of 0.064 microns at after develop inspection.

In this invention the first step is to choose an optimum beam which is the beam size giving the best XY-CD is chosen and the beam is fixed at this size. In this example the beam size with the best XY-CD is a square beam having a width 14 and length 16 both equal to about 1.5 microns. With this fixed beam size the test pattern of 121 test points formed in the same mask the X-CD had a range of 0.0294 microns with a 3-sigma of 0.0191 microns; the Y-CD had a range of 0.0316 microns with a 3-sigma of 0.0191 microns; and the XY-CD had a mean of 0.005 microns, a range of 0.0364 microns, and a 3-sigma of 0.0213 microns at after develop inspection.

With this optimum beam of about 1.5 microns by 1.5 microns the beam size is very stable with time. For a clear line of 1.5 microns the test pattern of 121 test points formed in the same mask the X mean at 22 minutes was 1.5323 microns at 22 minutes, 1.5306 microns at 56 minutes, and 1.527 microns at 99 minutes; and the Y mean at 22 minutes was 1.5347 microns at 22 minutes, 1.5337 microns at 56 minutes, and 1.5348 microns at 99 minutes at after develop inspection. The optimum beam is a square beam, in this example having a width of between about 2.0 and 0.01 microns.

Figure 5:
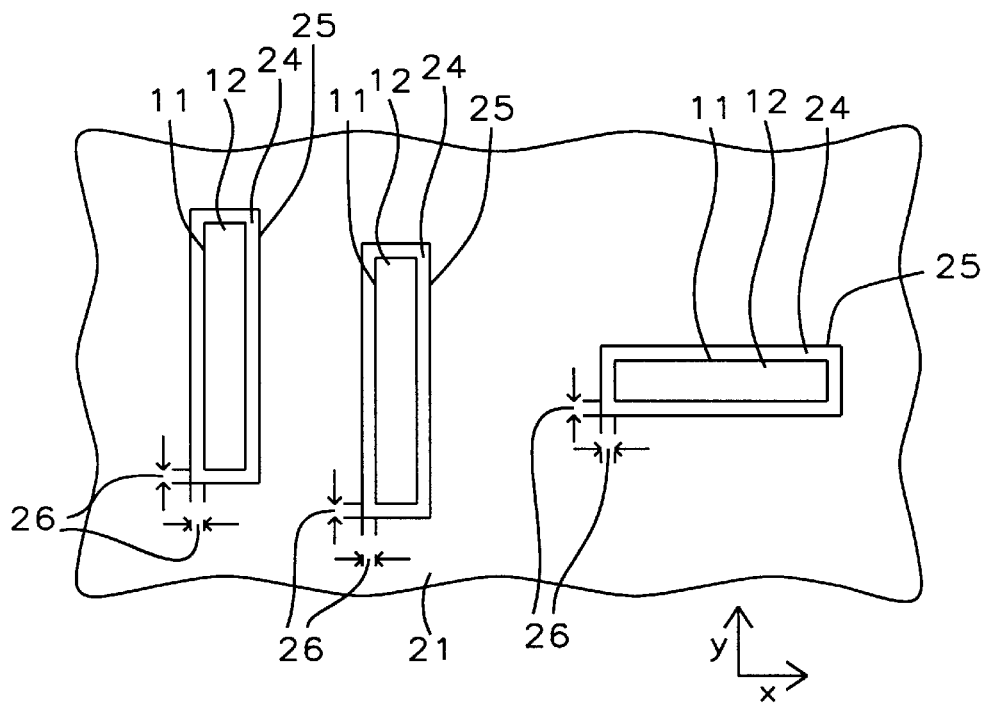
FIG. 5 shows a top view of the original pattern converted to the original pattern surrounded by a frame pattern of this invention.

The next step of the invention after choosing the optimum beam size as a square beam having a width of between about 2.0 and 0.01 microns is to form a frame pattern 24 around the outer periphery 11 of the first pattern elements 12 as shown in FIG. 5. FIG. 5 shows the first pattern elements 12 with a frame pattern 24 surrounding the outer perimeter 11 of each of the first pattern elements 12. Each frame pattern 24 also has an outer perimeter 25. There is a first distance 26 between each frame pattern 24 outer perimeter 25 and the outer perimeter 11 of the first pattern element 12 surrounded by that frame pattern 24. The first distance 26 is chosen to be equal to the width of the optimum square beam, in this example between about 2.0 and 0.01 microns.

The frame patterns 24 are then exposed in the layer of resist, reference number 10 in FIG. 3, using the optimum fixed beam. As shown in FIG. 5, the remainder of the entire exposure field 21 is the entire exposure field except for the regions of the exposure field occupied by the first pattern elements 12 and the frame patterns 24. After the exposure of the frame patterns 24 has been completed, the remainder of the entire exposure field 21 is then exposed in the layer of resist, reference number 10 in FIG. 3, using a variable beam size. The layer of resist is then developed which removes the exposed resist for a layer of positive resist or the unexposed resist for a layer of negative resist. The unexposed resist is that part of the resist within the frame patterns 24, which is the region occupied by the first pattern elements 12, see FIG. 5. The exposed resist is that part of the resist occupied by the frame patterns 24 and the remainder of the exposure field 21.

Alternatively the remainder of the entire exposure field 21, which is the entire exposure field except for the regions of the exposure field occupied by the first pattern elements 12 and the frame patterns 24, are first exposed in the layer of resist, reference number 10 in FIG. 3, using a variable beam size. After the exposure of the remainder of the entire exposure field 21 has been completed, the frame patterns 24 are then exposed in the layer of resist, reference number 10 in FIG. 3, using the optimum fixed beam. The layer of resist is then developed which removes the exposed resist for a layer of positive resist or the unexposed resist for a layer of negative resist. The unexposed resist is that part of the resist within the frame patterns 24, which is the region occupied by the first pattern elements 12, see FIG. 5. The exposed resist is that part of the resist occupied by the frame patterns 24 and the remainder of the exposure field 21.

In this invention the critical dimension control is maintained by exposing the critical regions of the frame patterns 24 with the square optimum beam, in this example having a width of between about 2.0 and 0.01 microns. The advantages of the variable beam size are retained for the less critical region of the remainder of the entire exposure field 21, which is the region outside the frame patterns 24 and the first pattern elements 12.

Figure 6:
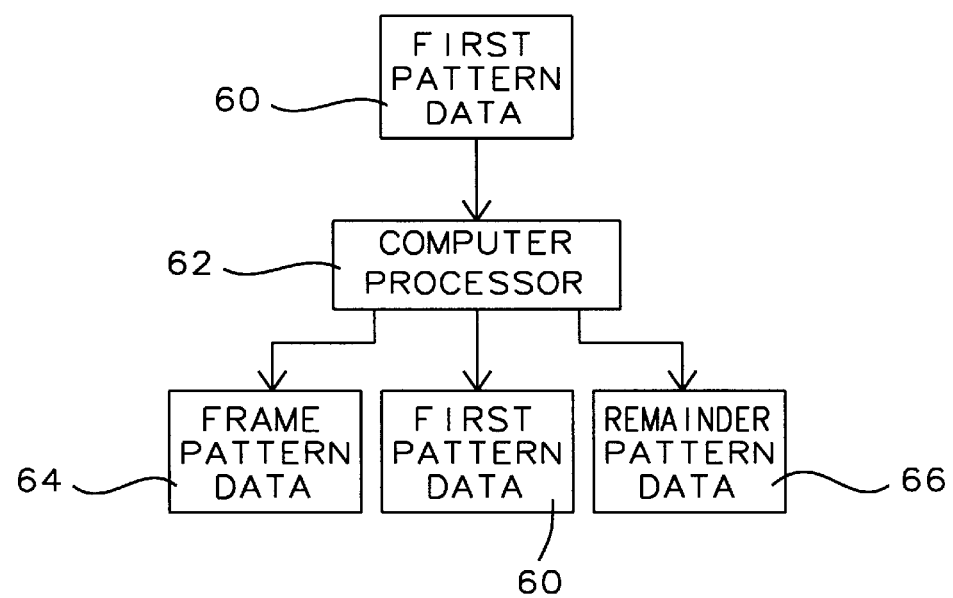
FIG. 6 shows a block diagram of the system used to form the digital design data for the frame pattern and the full exposure field except for the frame pattern and center pattern.

FIG. 6 shows a block diagram of the system used to form the design data for the pattern elements 24 and the remainder of the exposure field 21 from the design data for the first pattern elements 12, which is provided. As shown in FIG. 6, the provided first element design data 60 are fed into a computer processor 62. The computer processor 62 then determines the remainder of the exposure field digital design data 66 using the first pattern element digital data 60 by adding the first distance around the outer perimeters of each of the first pattern elements. The computer processor then forms the frame pattern digital design data 64 for the remainder of the exposure field by subtracting the first patterns and the frame patterns.

While the invention has been particularly shown and described with reference to the preferred embodiments thereof, it will be understood by those skilled in the art that various changes in form and details may be made without departing from the spirit and scope of the invention.

What is claimed is:

1. A method of forming patterns on integrated circuit wafers, comprising:
   providing a first pattern having a number of first pattern elements, wherein each of said first pattern elements has an outer perimeter;
   forming a frame pattern having a number of frame pattern elements, wherein said frame pattern has a frame pattern element for each of said first pattern elements, each of said frame pattern elements surrounds one of said first pattern elements, and said frame pattern elements consist of the region between said outer perimeter of said first pattern elements and a first distance away from said outer perimeter of said first pattern elements;
   forming a remainder pattern wherein said remainder pattern consists of said first pattern and said frame pattern subtracted from the entire exposure field;
   providing an integrated circuit wafer having a layer of resist formed thereon;
   providing an electron beam exposure system having an electron beam with a fixed beam size and an electron beam with a variable beam size;

exposing said frame pattern in said layer of resist using said electron beam exposure system with said fixed electron beam size, wherein said fixed electron beam size is square and has a width equal to said first distance;

exposing said remainder pattern in said layer of resist using said electron beam exposure system with said variable beam size; and developing said layer of resist after said exposing said frame pattern and said exposing said remainder pattern have been completed.

2. The method of claim 1 wherein said first pattern is formed using a computer processor and first pattern digital design data.

3. The method of claim 1 further comprising:

providing first pattern digital design data;

providing a computer processor; and forming remainder pattern digital design data using said computer processor and said first pattern digital design data to add said first distance around the outer perimeter of each of said first pattern elements.

4. The method of claim 3 wherein said exposing said remainder pattern in said layer of resist uses said remainder pattern digital design data to control said electron beam exposure system.

5. The method of claim 1 further comprising:

providing first pattern digital design data;

providing a computer processor;

forming frame pattern digital design data using said computer processor and said first pattern digital design data to form said first pattern; and subtracting said remainder pattern, thereby forming said frame pattern digital design data.

6. The method of claim 5 wherein said exposing said frame pattern in said layer of resist uses said frame pattern digital design data to control said electron beam exposure system.

7. The method of claim 1 wherein said first distance is between about 2.0 and 0.01 micrometers.

8. The method of claim 1 wherein said exposing said frame pattern is completed before said exposing said remainder pattern is carried out.

9. The method of claim 1 wherein said exposing said remainder pattern is completed before said exposing said frame pattern is carried out.

10. A method of forming patterns on a mask substrate, comprising:

providing a first pattern having a number of first pattern elements, wherein each of said first pattern elements has an outer perimeter;

forming a frame pattern having a number of frame pattern elements, wherein said frame pattern has a frame pattern element for each of said first pattern elements, each of said frame pattern elements surrounds one of said first pattern elements, and said frame pattern elements consist of the region between said outer perimeter of said first pattern elements and a first distance away from said outer perimeter of said first pattern elements;

forming a remainder pattern wherein said remainder pattern consists of said first pattern and said frame pattern subtracted from the entire exposure field;

providing a transparent mask substrate having a layer of opaque material formed on said transparent mask substrate and a layer of resist formed on said layer of opaque material;

providing an electron beam exposure system having an electron beam with a fixed beam size and an electron beam with a variable beam size;

exposing said frame pattern in said layer of resist using said electron beam exposure system with said fixed electron beam size, wherein said fixed electron beam size is square and has a width equal to said first distance;

exposing said remainder pattern in said layer of resist using said electron beam exposure system with said variable beam size;

developing said layer of resist after said exposing said frame pattern and said exposing said remainder pattern have been completed; and etching away that part of said layer of opaque material not covered by said layer of developed resist.

11. The method of claim 10 wherein said first pattern is formed using a computer processor and first pattern digital design data.

12. The method of claim 10 further comprising:

providing first pattern design digital data;

providing a computer processor; and forming remainder pattern digital design data using said computer processor and said first pattern digital design data to add said first distance around the outer perimeter of each of said first pattern elements.

13. The method of claim 12 wherein said exposing said remainder pattern in said layer of resist uses said remainder pattern digital design data to control said electron beam exposure system.

14. The method of claim 10 further comprising:

providing first pattern digital design data;

providing a computer processor;

forming frame pattern digital design data by using said computer processor and said first pattern digital design data to form said first pattern; and subtracting said remainder pattern, thereby forming said frame pattern digital design data.

15. The method of claim 14 wherein said exposing said frame pattern in said layer of resist uses said frame pattern digital design data to control said electron beam exposure system.

16. The method of claim 10 wherein said first distance is between about 2.0 and 0.01 micrometers.

17. The method of claim 10 wherein said exposing said frame pattern is completed before said exposing said remainder pattern is carried out.

18. The method of claim 10 wherein said exposing said remainder pattern is completed before said exposing said frame pattern is carried out.

* * * * *